United States Patent
Yang et al.

(10) Patent No.: US 11,340,734 B2
(45) Date of Patent: May 24, 2022

(54) TOUCH CONTROL MICRO LIGHT EMITTING DIODE DISPLAY APPARATUS, METHOD OF OPERATING TOUCH CONTROL MICRO LIGHT EMITTING DIODE DISPLAY APPARATUS, AND METHOD OF FABRICATING TOUCH CONTROL MICRO LIGHT EMITTING DIODE DISPLAY APPARATUS

(71) Applicant: BOE Technology Group Co., Ltd., Beijing (CN)

(72) Inventors: Shengji Yang, Beijing (CN); Xiaochuan Chen, Beijing (CN); Hui Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 189 days.

(21) Appl. No.: 16/769,735

(22) PCT Filed: Jul. 10, 2019

(86) PCT No.: PCT/CN2019/095442
§ 371 (c)(1),
(2) Date: Jun. 4, 2020

(87) PCT Pub. No.: WO2021/003702
PCT Pub. Date: Jan. 14, 2021

(65) Prior Publication Data
US 2022/0004304 A1 Jan. 6, 2022

(51) Int. Cl.
*G06F 3/041* (2006.01)
*G06F 3/044* (2006.01)
(Continued)

(52) U.S. Cl.
CPC ........ *G06F 3/04184* (2019.05); *G06F 3/0412* (2013.01); *G06F 3/0443* (2019.05);
(Continued)

(58) Field of Classification Search
CPC ..... G06F 3/0446; G06F 3/2007; H02L 33/005
(Continued)

(56) References Cited

U.S. PATENT DOCUMENTS

| 2014/0313438 | A1  | 10/2014 | Jun  |                 |
|--------------|-----|---------|------|-----------------|
| 2020/0073530 | A1* | 3/2020  | Kim  | ... G06F 3/041661 |
| 2020/0348772 | A1* | 11/2020 | Chen | ... G06F 3/041   |

FOREIGN PATENT DOCUMENTS

| CN | 105702205 A | 6/2016 |
|----|-------------|--------|
| CN | 107168574 A | 9/2017 |

(Continued)

OTHER PUBLICATIONS

International Search Report & Written Opinion dated Apr. 9, 2020, regarding PCT/CN2019/095442.

*Primary Examiner* — Calvin C Ma
(74) *Attorney, Agent, or Firm* — Intellectual Valley Law, P.C.

(57) ABSTRACT

A touch control micro light emitting diode (micro LED) display apparatus is provided. The touch control micro LED display apparatus includes a base substrate; a first electrode layer on the base substrate; a second electrode layer on a side of the first electrode layer away from the base substrate, wherein the second electrode layer includes a plurality of second electrodes spaced apart from each other; an insulating layer on a side of the second electrode layer away from the base substrate; and a third electrode layer on a side of the insulating layer away from the base substrate, wherein the third electrode layer includes a plurality of third electrodes spaced apart from each other. The touch control micro LED (Continued)

display apparatus is operated in a time-division driving mode including an image display mode and a touch control mode.

20 Claims, 6 Drawing Sheets

(51) Int. Cl.
*G09G 3/20* (2006.01)
*G09G 3/32* (2016.01)
*H01L 27/15* (2006.01)
*H01L 33/00* (2010.01)
*H01L 33/06* (2010.01)
*H01L 33/38* (2010.01)

(52) U.S. Cl.
CPC ........ *G06F 3/0446* (2019.05); *G06F 3/04166* (2019.05); *G09G 3/2007* (2013.01); *G09G 3/32* (2013.01); *H01L 27/156* (2013.01); *H01L 33/005* (2013.01); *H01L 33/06* (2013.01); *H01L 33/38* (2013.01); *G06F 2203/04103* (2013.01); *G06F 2203/04112* (2013.01)

(58) Field of Classification Search
USPC ........................................................ 345/174
See application file for complete search history.

(56) References Cited

FOREIGN PATENT DOCUMENTS

| CN | 107870697 A | 4/2018 |
|---|---|---|
| CN | 109559679 A | 4/2019 |

\* cited by examiner

TOUCH CONTROL MICRO LIGHT EMITTING DIODE DISPLAY APPARATUS, METHOD OF OPERATING TOUCH CONTROL MICRO LIGHT EMITTING DIODE DISPLAY APPARATUS, AND METHOD OF FABRICATING TOUCH CONTROL MICRO LIGHT EMITTING DIODE DISPLAY APPARATUS

CROSS-REFERENCE TO RELATED APPLICATION

This application is a national stage application under 35 U.S.C. § 371 of International Application No. PCT/CN2019/095442, filed Jul. 10, 2019, the contents of which are incorporated by reference in the entirety.

TECHNICAL FIELD

The present invention relates to display technology, more particularly, to a touch control micro light emitting diode display apparatus, a method of operating a touch control micro light emitting diode display apparatus, and a method of fabricating a touch control micro light emitting diode display apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides a touch control micro light emitting diode (micro LED) display apparatus, comprising a base substrate; a first electrode layer on the base substrate; a second electrode layer on a side of the first electrode layer away from the base substrate, wherein the second electrode layer comprises a plurality of second electrodes spaced apart from each other; an insulating layer on a side of the second electrode layer away from the base substrate; and a third electrode layer on a side of the insulating layer away from the base substrate, wherein the third electrode layer comprises a plurality of third electrodes spaced apart from each other; wherein the touch control micro LED display apparatus is operated in a time-division driving mode comprising an image display mode and a touch control mode; the plurality of second electrodes and the plurality of third electrodes are touch electrodes of a mutual capacitive type in the touch control mode; and the plurality of second electrodes are cathodes for a plurality of micro LEDs in the image display mode.

Optionally, the touch control micro LED display apparatus further comprises a first type doped semiconductor layer on a side of the first electrode layer away from the base substrate and electrically connected to the first electrode layer; a quantum-well layer on a side of the first type doped semiconductor layer away from the base substrate; a second type doped semiconductor layer on a side of the quantum-well layer away from the base substrate; and a spacer layer on a side of the second type doped semiconductor layer away from the base substrate; wherein the spacer layer comprises a plurality of spacers, the plurality of spacers and the plurality of second electrodes are alternately arranged; and two adjacent second electrodes of the plurality of second electrodes are spaced apart by one of the plurality of spacers.

Optionally, the plurality of third electrodes are arranged along a first direction; the plurality of second electrodes are arranged along a second direction; the plurality of spacers are arranged along the second direction; and the second direction is different from the first direction.

Optionally, an orthographic projection of a respective one of the plurality of second electrodes on the base substrate at least partially overlaps with an orthographic projection of a row of micro LEDs of the plurality of micro LEDs along the first direction on the base substrate; and an orthographic projection of a respective one of the plurality of third electrodes on the base substrate at least partially overlaps with an orthographic projection of a column of micro LEDs of the plurality of micro LEDs along the second direction on the base substrate.

Optionally, the touch control micro LED display apparatus further comprises a touch driving circuit; wherein the plurality of second electrodes are electrically connected to the touch driving circuit; in the image display mode, the touch driving circuit is configured to provide a common voltage to the plurality of second electrodes; in the touch control mode, the touch driving circuit is configured to provide touch scanning signals respectively to the plurality of second electrodes; and in the touch control mode, the plurality of third electrodes are configured to respectively transmit touch sensing signals to the touch driving circuit.

Optionally, the touch control micro LED display apparatus further comprises a pixel driving circuit for driving light emission of a respective one of the plurality of micro LEDs in the image display mode; wherein, in the touch control mode, at least one of signal lines of the pixel driving circuit is configured to transmit a signal having a waveform corresponding to a waveform of the touch scanning signals.

Optionally, a reset signal line, a light emitting control signal line, and one or more gate scanning lines connected to the pixel driving circuit are configured to transmit the signal having the waveform corresponding to the waveform of the touch scanning signals.

Optionally, the signal having the waveform corresponding to the waveform of the touch scanning signals is the same as the touch scanning signals.

Optionally, the pixel driving circuit comprises a current modulating sub-circuit and a duration modulating sub-circuit; wherein, in the image display mode, the current modulating sub-circuit is configured to generate a compensated current signal based on a data signal, and transmit the compensated current signal to the duration modulating sub-circuit; and the duration modulating sub-circuit is configured to receive the compensated current signal from the current modulating sub-circuit, and control a grayscale value of light emitted from the respective one of the plurality of micro LEDs based on time integration of the compensated current signal.

Optionally, the duration modulating sub-circuit comprises a first transistor having a source electrode connected to the current modulating sub-circuit, a drain electrode connected to the respective one of the plurality of micro LEDs; a second transistor having a source electrode connected to a data line, a drain electrode connected to a gate electrode of the first transistor, and a gate electrode connected to a gate line; and a capacitor having a first electrode connected to the drain electrode of the second transistor and the gate electrode of the first transistor, and a second electrode configured to be provided with a common voltage.

Optionally, the first electrode layer comprises a plurality of first electrode blocks; the first type doped semiconductor layer comprises a plurality of first type doped semiconductor blocks; the quantum-well layer comprises a plurality of quantum-well blocks; the second type doped semiconductor layer comprises a plurality of second type doped semiconductor blocks; a respective one of the plurality of micro LEDs comprises a respective one of the plurality of first electrode blocks, a respective one of the plurality of first type doped semiconductor blocks, a respective one of the plurality of quantum-well blocks, and a respective one of the plurality of second type doped semiconductor blocks; the respective one of the plurality of second type doped semiconductor blocks of the respective one of the plurality of micro LEDs is electrically connected to one of the plurality of second electrodes; and an orthographic projection of the respective one of the plurality of first electrode blocks on the base substrate at least partially overlaps with an orthographic projection of the one of the plurality of second electrodes on the base substrate.

Optionally, the touch control micro LED display apparatus further comprises a pixel definition layer defining a plurality of subpixel apertures; wherein the respective one of the plurality of first electrode blocks, the respective one of the plurality of first type doped semiconductor blocks, the respective one of the plurality of quantum-well blocks, and the respective one of the plurality of second type doped semiconductor blocks, of the respective one of the plurality of micro LEDs, are in a respective one of the plurality of subpixel apertures; and the second electrode layer and the spacer layer are on a side of the pixel definition layer away from the base substrate.

In another aspect, the present invention provides a method of operating a touch control micro light emitting diode (micro LED) display apparatus; wherein the touch control micro LED display apparatus comprises a base substrate; a first electrode layer on the base substrate; a second electrode layer on a side of the first electrode layer away from the base substrate, wherein the second electrode layer comprises a plurality of second electrodes spaced apart from each other; an insulating layer on a side of the second electrode layer away from the base substrate; and a third electrode layer on a side of the insulating layer away from the base substrate, wherein the third electrode layer comprises a plurality of third electrodes spaced apart from each other; wherein the method comprises operating the touch control micro LED display apparatus in a time-division driving mode comprising an image display mode and a touch control mode; detecting a touch in the touch control mode using the plurality of second electrodes and the plurality of third electrodes as touch electrodes of a mutual capacitive type; providing a common voltage to the plurality of second electrodes in the image display mode; and displaying an image using a plurality of micro LEDs with the plurality of second electrodes as cathodes for the plurality of micro LEDs.

Optionally, the method further comprises transmitting touch scanning signals respectively to the plurality of second electrodes in the touch control mode; and detecting touch sensing signals transmitted from the plurality of third electrodes in the touch control mode.

Optionally, the method further comprises, in the touch control mode, transmitting a signal having a waveform corresponding to a waveform of the touch scanning signals to at least one of signal lines of a pixel driving circuit for driving light emission of a respective one of the plurality of micro LEDs.

Optionally, the method comprises, in the touch control mode, transmitting the signal having the waveform corresponding to a waveform of the touch scanning signals to a reset signal line, a light emitting control signal line, and one or more gate scanning lines connected to the pixel driving circuit.

Optionally, the signal having the waveform corresponding to the waveform of the touch scanning signals is the same as the touch scanning signals.

Optionally, in the image display mode, the method further comprises generating a compensated current signal based on a data signal; and controlling a grayscale value of light emitted from the respective one of the plurality of micro LEDs based on time integration of the compensated current signal.

In another aspect, the present invention provides a method of fabricating a touch control micro light emitting diode (micro LED) display apparatus, comprising forming a first electrode layer on a base substrate; forming a second electrode layer on a side of the first electrode layer away from the base substrate, wherein the second electrode layer comprises a plurality of second electrodes spaced apart from each other; forming an insulating layer on a side of the second electrode layer away from the base substrate; and forming a third electrode layer on a side of the insulating layer away from the base substrate, wherein the third electrode layer comprises a plurality of third electrodes spaced apart from each other; wherein the touch control micro LED display apparatus is operated in a time-division driving mode comprising an image display mode and a touch control mode; the plurality of second electrodes and the plurality of third electrodes are touch electrodes of a mutual capacitive type in the touch control mode; and the plurality of second electrodes are cathodes for a plurality of micro LEDs in the image display mode.

Optionally, the method further comprises forming a plurality of micro LED precursor units, comprising forming a second type doped semiconductor layer on a growth substrate; forming a quantum-well layer on a side of the second type doped semiconductor layer away from the growth substrate; forming a first type doped semiconductor layer on a side of the quantum-well layer away from the growth substrate; and forming the first electrode layer on a side of the first type doped semiconductor layer away from the growth substrate; wherein the method further comprises forming a pixel definition layer on the base substrate to define a plurality of subpixel apertures; and transferring the plurality of micro LED precursor units respectively into the plurality of subpixel apertures; wherein forming the second electrode layer is performed subsequent to transferring the plurality of micro LED precursor units into the plurality of subpixel apertures.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a novel touch control micro LED display apparatus, a method of operating a touch control micro LED display apparatus, and a method of fabricating a touch control micro LED display apparatus that substantially obviate one or more of the problems due to limitations and disadvantages of the related art. In one aspect, the present disclosure provides a touch control micro LED display apparatus. In some embodiments, the touch control micro LED display apparatus includes a base substrate; a first electrode layer on the base substrate; and a second electrode layer on a side of the first electrode layer away from the base substrate, wherein the second electrode layer includes a plurality of second electrodes; an insulating layer on a side of the second electrode layer away from the base substrate; and a third electrode layer on a side of the insulating layer away from the base substrate, wherein the third electrode layer includes a plurality of third electrodes spaced apart from each other. Optionally, the touch control micro LED display apparatus is operated in a time-division driving mode including an image display mode and a touch control mode. The plurality of second electrodes and the plurality of third electrodes are touch electrodes of a mutual capacitive type in the touch control mode. The plurality of second electrodes are cathodes for a plurality of micro LEDs in the image display mode.

Figure 1:
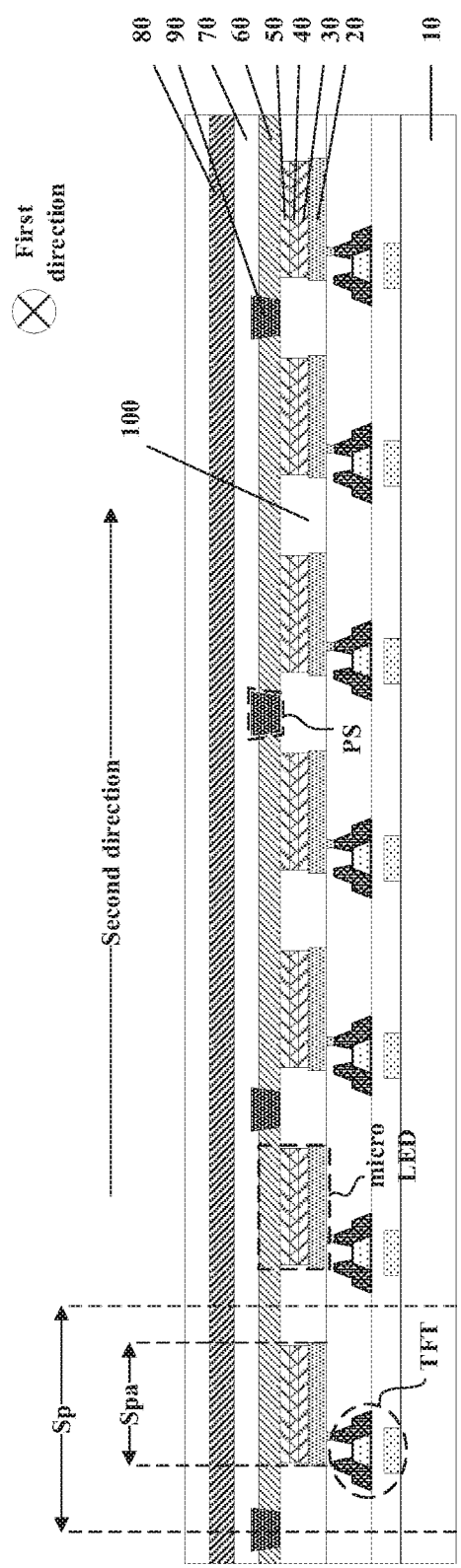
FIG. 1 is a schematic diagram illustrating the structure of a touch control micro LED display apparatus in some embodiments according to the present disclosure.

FIG. 1 is a schematic diagram illustrating the structure of a touch control micro LED display apparatus in sonic embodiments according to the present disclosure. Referring to FIG. 1, the touch control micro LED display apparatus has a plurality of subpixels Sp. In some embodiments, the touch control micro LED display apparatus includes a base substrate 10; a first electrode layer 20 on the base substrate 10; a first type doped semiconductor layer 30 on a side of the first electrode layer 20 away from the base substrate 10 and electrically connected to the first electrode layer 20; a quantum-well layer 40 on a side of the first type doped semiconductor layer 30 away from the base substrate 10; a second type doped semiconductor layer 50 on a side of the quantum-well layer 40 away from the base substrate 10; a second electrode layer 60 on a side of the second type doped semiconductor layer 50 away from the base substrate 10, and electrically connected to the second type doped semiconductor layer 50, an insulating layer 70 on a side of the second electrode layer 60 away from the base substrate 10; and a third electrode layer 80 on a side of the insulating layer 70 away from the base substrate 10. Optionally, the touch control micro LED display apparatus includes a plurality of micro LEDs, a respective one of which is in a respective one of the plurality of subpixels Sp.

Optionally, the first type doped semiconductor layer 30 is formed using a material selected from a group consisting of P-doped semiconductor materials and N-doped semiconductor materials, Optionally, the second type doped semiconductor layer 50 is formed using a material selected from a group consisting of P-doped semiconductor materials and N-doped semiconductor materials. In one example, the P-doped semiconductor materials include p-GaN. In another example, the N-doped semiconductor materials include N—GaN. Optionally, the quantum-well layer 40 includes multiple quantum wells (MQW). In one example, the quantum-well layer 40 include a single layer having multiple quantum wells. In another example, the quantum-well layer 40 includes multiple sublayers having multiple quantum wells. Optionally, the first type doped semiconductor layer 30, the quantum-well layer 40, and the second type doped semiconductor layer 50 are independently formed by metal organic chemical vapor deposition.

Figure 2:
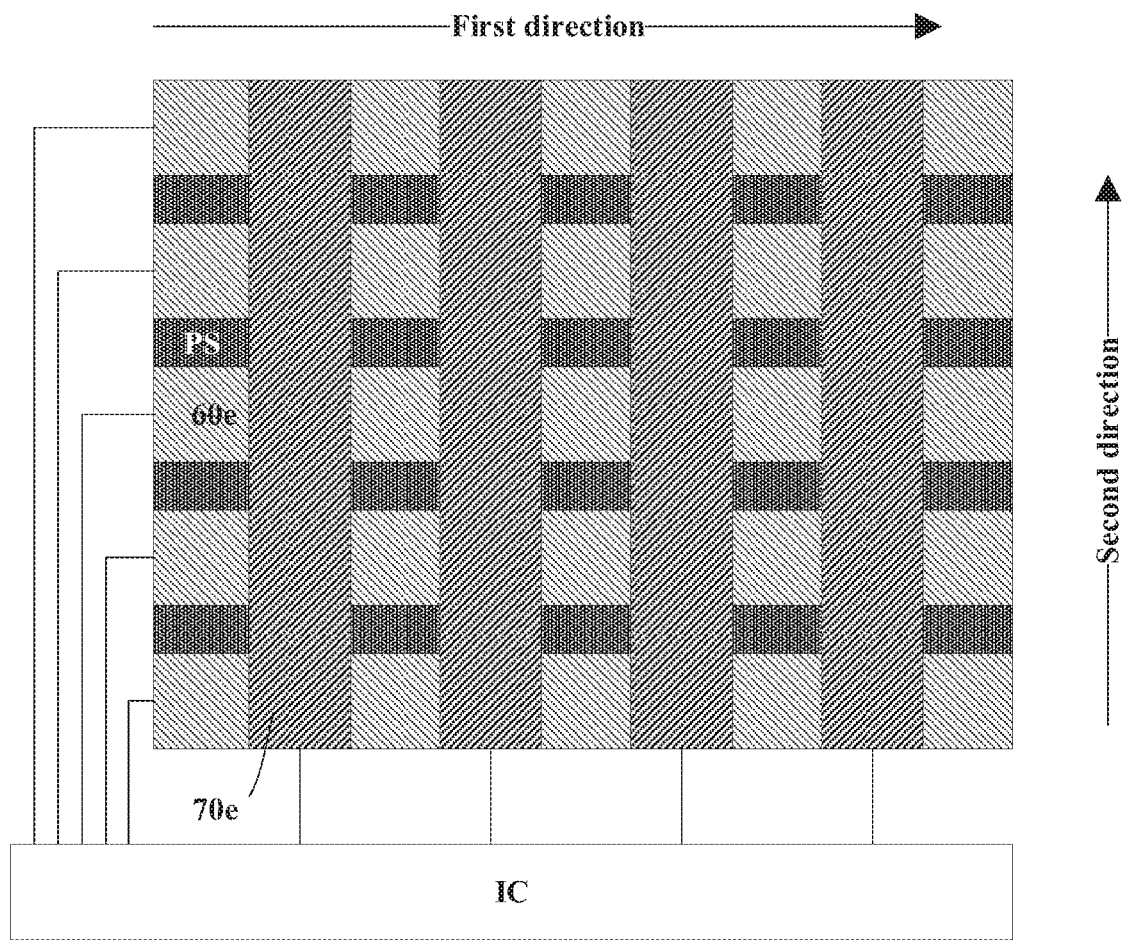
FIG. 2 is a plan view of a second electrode layer and a third electrode layer in a touch control micro LED display apparatus in some embodiments according to the present disclosure.

FIG. 2 is a plan view of a second electrode layer and a third electrode layer in a touch control micro LED display apparatus in some embodiments according to the present disclosure. Referring to FIG. 2, in some embodiments, the second electrode layer 60 includes a plurality of second electrodes 60e spaced apart from each other, and the third electrode layer includes a plurality of third electrodes 70e spaced apart from each other. In some embodiments, the plurality of second electrodes 60e are arranged along a second direction (e.g., a column direction), and the plurality of third electrodes 70e are arranged along a first direction (e.g., a row direction). The second direction is different from the first direction. Optionally, the second direction is substantially perpendicular to the first direction. Each of the plurality of second electrodes 60e extends along the first direction, and each of the plurality of third electrodes 70e extends along the second direction. A plurality of rows of the plurality of second electrodes 60e and a plurality of columns of the plurality of third electrodes 70e cross over each other forming a plurality of intersections.

Various appropriate materials may be used for making the plurality of second electrodes 60e and the plurality of third electrodes 70e. Examples of transparent conductive materials suitable for making the plurality of second electrodes 60e and the plurality of third electrodes 70e include, but are not limited to, a transparent metal oxide material, nano-silver, nano-carbon tube, and grapheme. Examples of transparent metal oxide materials include, but are not limited to, indium tin oxide, indium zinc oxide, indium gallium oxide, indium gallium zinc oxide. Optionally, the plurality of second electrodes 60e and/or the plurality of third electrodes 70e are mesh electrodes. Examples of transparent conductive materials suitable for making the mesh electrodes include, but are not limited to, a metal mesh, a silver nano wire, a carbon nano tube, a nano mesh, graphene, and conductive polymers such as poly(3,4-ethylenedioxythiophene) polystyrene sulfonate (PEDOT:PSS). Optionally, the mesh electrodes are made of a metal mesh such as a nano-silver mesh. Optionally, the plurality of second electrodes 60e and/or the plurality of third electrodes 70e are stripe electrodes as shown in FIG. 2.

Figure 3A:
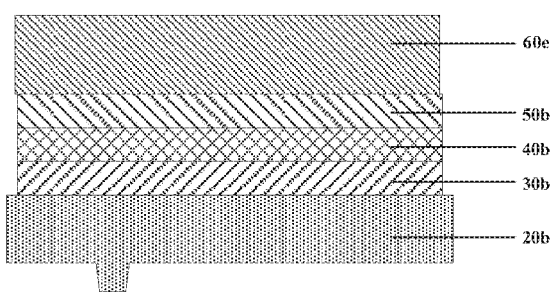
FIG. 3A is a schematic diagram illustrating the structure of a micro LED in a touch control micro LED display apparatus in some embodiments according to the present disclosure.

FIG. 3A is a schematic diagram illustrating the structure of a micro LED in a touch control micro LED display apparatus in some embodiments according to the present disclosure. Referring to FIG. 1 and FIG. 3A, in some embodiments, the first electrode layer 20 includes a plurality of first electrode blocks 20b; the first type doped semiconductor layer 30 includes a plurality of first type doped semiconductor blocks 30b; the quantum-well layer 40 includes a plurality of quantum-well blocks 40b; and the second type doped semiconductor layer 50 includes a plurality of second type doped semiconductor blocks 50b. In some embodiments, a respective one of the plurality of micro LEDs includes a respective one of the plurality of first electrode blocks 20b, a respective one of the plurality of first type doped semiconductor blocks 30b, a respective one of the plurality of quantum-well blocks 40b, and a respective one of the plurality of second type doped semiconductor blocks 50b. The respective one of the plurality of second type doped semiconductor blocks 50b of the respective one of the plurality of micro LEDs is electrically connected to one of the plurality of second electrodes 60e. In the present micro LED, optionally, an orthographic projection of the respective one of the plurality of first electrode blocks 20b on the base substrate 10 at least partially overlaps with an orthographic projection of the one of the plurality of second electrodes 60e on the base substrate 10. In one example, the orthographic projection of the one of the plurality of second electrodes 60e on the base substrate 10 covers the orthographic projection of the respective one of the plurality of first electrode blocks 20b on the base substrate 10. Optionally, the respective one of the plurality of first electrode blocks 20b is a reflective electrode block.

Figure 3B:
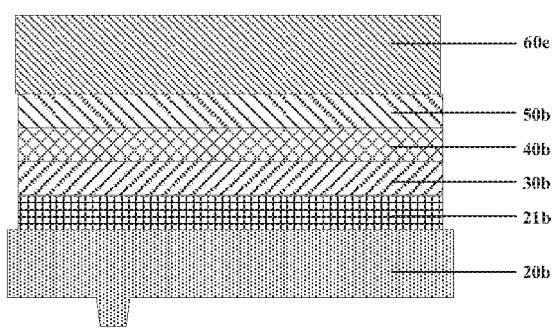
FIG. 3B is a schematic diagram illustrating the structure of a micro LED in a touch control micro LED display apparatus in some embodiments according to the present disclosure.

FIG. 3B is a schematic diagram illustrating the structure of a micro LED in a touch control micro LED display apparatus in some embodiments according to the present disclosure. Referring to FIG. 3B, in some embodiments, the respective one of the plurality of micro LEDs further includes a reflective block 21b between the respective one of the plurality of first type doped semiconductor blocks 30b and the respective one of the plurality of first electrode blocks 20b. Various types of reflective structures can be used to form the reflective block 21b. Examples of reflective structures include distributed Bragg reflectors and silver mirror structures. In some embodiments, the reflective block 21b is a distributed Bragg reflector. Optionally, the distributed Bragg reflector includes a plurality of high refractive index sub-layers and a plurality of low refractive index sub layers alternatively arranged, e.g., having a HL . . . HL structure, wherein H stands for a sub-layer having a high refractive index, and L stands for a sub-layer having a low refractive index. So, the distributed Bragg reflector has a multi-layer structure, which equivalent to a group of Photonic Crystals. Optionally, the H sub-layer includes titanium oxide and the L sub-layer includes silicon oxide. Optionally, the H sub-layer includes hafnium oxide and the L sub-layer includes silicon oxide. Optionally, the H sub-layer includes gallium nitride and the L sub-layer includes aluminum nitride. Optionally, the H sub-layer includes aluminum gallium nitride and the L sub-layer includes gallium nitride. Optionally, the H sub-layer includes aluminum gallium arsenide and the L sub-layer includes gallium arsenide.

Referring to FIG. 1 and FIG. 2, in some embodiments, the touch control micro LED display apparatus further includes a spacer layer 90 on a side of the second type doped semiconductor layer 50 away from the base substrate 10. The spacer layer 90 includes a plurality of spacers PS. As shown in FIG. 2, the plurality of spacers PS are arranged along the second direction, and each of the plurality of spacers PS extends along the first direction. The plurality of spacers PS and the plurality of second electrodes 60e are alternately arranged. Two adjacent second electrodes of the plurality of second electrodes 60e are spaced apart by one of the plurality of spacers PS. Various appropriate insulating materials may be used for making the plurality of spacers PS. Examples of insulating materials suitable for making the plurality of spacers PS include, a transparent insulating material such as a resin, a photoresist material, $SiO_x$ and $SiN_x$.

In some embodiments, the plurality of spacers PS are made of a negative photoresist material. Patterning of the negative photoresist material to form the plurality of spacers PS results in an undercut profile. For example, a cross-section of a respective one of the plurality of spacers PS along a plane perpendicular to the base substrate 10 and intersecting the plurality of spacers PS has a substantially trapezoidal shape, as shown in FIG. 1. By forming the plurality of spacers PS having the undercut profile, short circuit between adjacent second electrodes of the plurality of second electrodes 60e during the step of forming the plurality of second electrodes 60e can be prevented.

In the present touch control micro LED display apparatus, a respective one of the plurality of second electrodes 60e is commonly shared by a plurality of micro LEDs. Referring to FIG. 1, in some embodiments, a respective one of the plurality of second electrodes 60e is commonly shared by a plurality of rows of the plurality of micro LEDs. Optionally, an orthographic projection of a respective one of the plurality of second electrodes 60e on the base substrate 10 at least partially overlaps with an orthographic projection of a row of micro LEDs of the plurality of micro LEDs along the first direction on the base substrate 10. In one example, the orthographic projection of a respective one of the plurality of second electrodes 60e on the base substrate 10 covers the orthographic projection of a row of micro LEDs of the plurality of micro LEDs along the first direction on the base substrate 10. Optionally, an orthographic projection of a respective one of the plurality of third electrodes 70e on the base substrate 10 at least partially overlaps with an orthographic projection of a column of micro LEDs of the plurality of micro LEDs along the second direction on the base substrate 10. In one example, the orthographic projection of a respective one of the plurality of third electrodes 70e on the base substrate 10 covers the orthographic projection of a column of micro LEDs of the plurality of micro LEDs along the second direction on the base substrate 10.

Referring to FIG. 1, in some embodiments, the touch control micro LED display apparatus further includes a pixel definition layer 100 defining a plurality of subpixel apertures Spa. Optionally, the second electrode layer 60 and the spacer layer 90 are on a side of the pixel definition layer 100 away from the base substrate 10. Optionally, and referring to FIG. 1, FIG. 3A, and FIG. 3B, the respective one of the plurality of first electrode blocks 20b, the respective one of the plurality of first type doped semiconductor blocks 30b, the respective one of the plurality of quantum-well blocks 40b, and the respective one of the plurality of second type doped semiconductor blocks 50b, of the respective one of the plurality of micro LEDs, are in a respective one of the plurality of subpixel apertures Spa. Various appropriate insulating materials may be used for making the pixel definition layer 100. Examples of insulating materials suitable for making the pixel definition layer 100 include, a transparent insulating material such as a resin, a photoresist material, $SiO_x$ and $SiN_x$.

Referring to FIG. 1, in some embodiments, the touch control micro LED display apparatus further includes a plurality of thin film transistors TFT on the base substrate 10, for driving light emission of the plurality of micro LEDs. A respective one of the plurality of thin film transistors TFT is electrically connected to a respective one of the plurality of micro LEDs. In one example, a drain electrode of the respective one of the plurality of thin film transistors TFT is electrically connected to a respective one of the plurality of first electrode blocks 20b of the respective one of the plurality of micro LEDs.

In some embodiments, and referring to FIG. 2, the touch control micro LED display apparatus further includes a touch driving circuit IC. The plurality of second electrodes 60e and the plurality of third electrodes 70e are electrically connected to the touch driving circuit IC. Optionally, the plurality of second electrodes 60e and the plurality of third electrodes 70e are touch scanning electrodes and touch sensing electrodes of a mutual capacitive type of touch control device. In one example, the second electrodes 60e are touch scanning electrodes configured to transmit touch scanning signals, and the plurality of third electrodes 70e are touch sensing electrodes configured to transmit touch sensing signals. In another example, the second electrodes 60e are touch sensing electrodes configured to transmit touch sensing signals, and the plurality of third electrodes 70e are touch scanning electrodes configured to transmit touch scanning signals.

In some embodiments, the touch control micro LED display apparatus is operated in a time-division driving mode including an image display mode and a touch control mode. In some embodiments, in the image display mode, the plurality of second electrodes 60e are cathodes for a plurality of micro LEDs, and are configured to be provided with a common voltage. In the image display mode, the touch driving circuit IC is configured to provide the common voltage to the plurality of second electrodes 60e. In some embodiments, in the touch control mode, the touch driving circuit IC is configured to provide touch scanning signals respectively to the plurality of second electrodes 60e, and is configured to receive touch sensing signals respectively from the plurality of third electrodes 70e. The plurality of third electrodes 70e are configured to respectively transmit touch sensing signals to the touch driving circuit IC, in the touch control mode.

Figure 4:
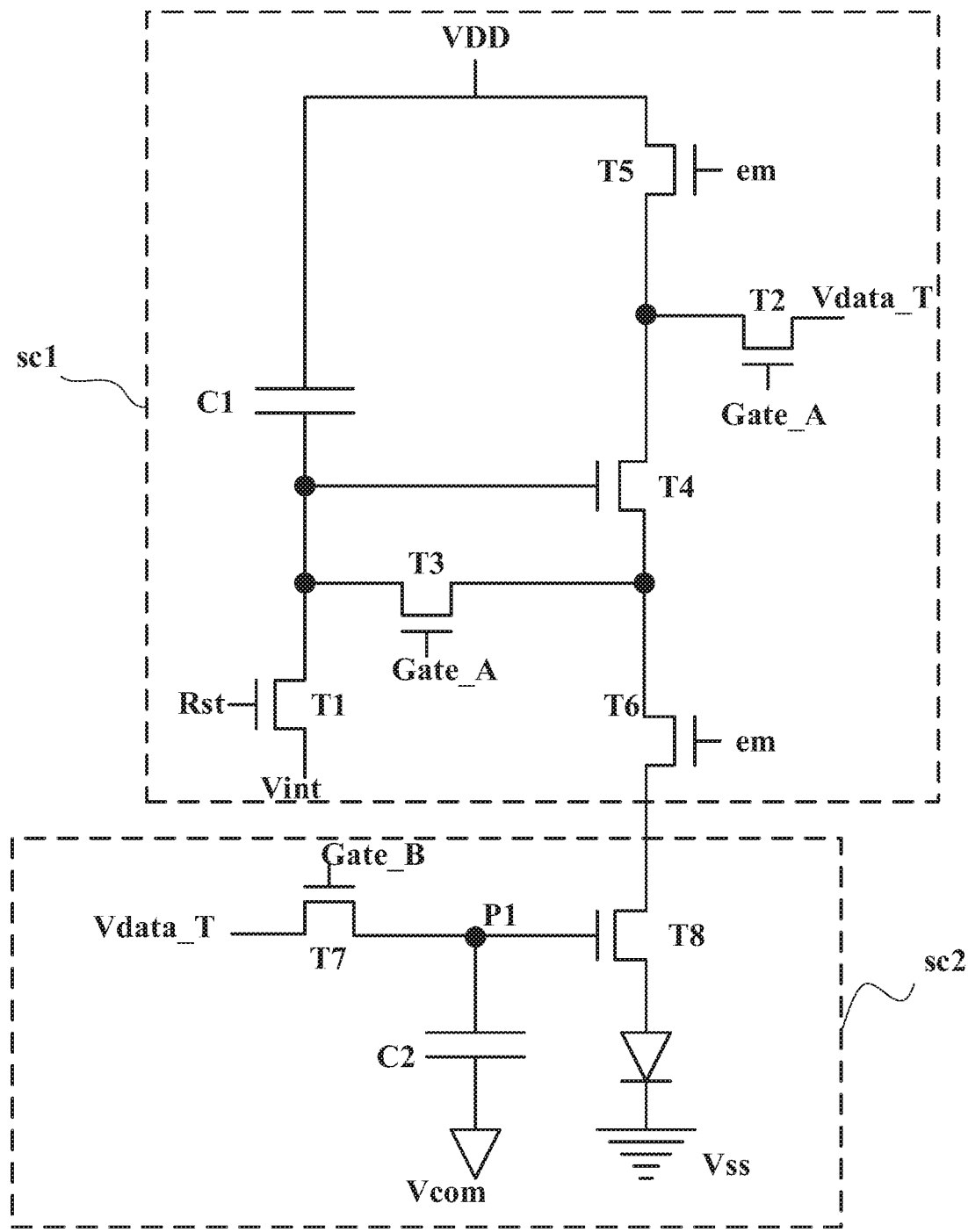
FIG. 4 is a circuit diagram of a pixel driving circuit for driving light emission of a micro LED in a touch control micro LED display apparatus in some embodiments according to the present disclosure.

In some embodiments, the touch control micro LED display apparatus further includes a pixel driving circuit for driving light emission of a respective one of the plurality of micro LEDs in the image display mode. FIG. 4 is a circuit diagram of a pixel driving circuit for driving light emission of a micro LED in a touch control micro LED display apparatus in some embodiments according to the present disclosure. Referring to FIG. 4, in some embodiments, the pixel driving circuit includes a current modulating sub-circuit sc1 and a duration modulating sub-circuit sc2. In the image display mode, the current modulating sub-circuit sc1 is configured to generate a compensated current signal based on a data signal input into the current modulating sub-circuit sc1, and transmit the compensated current signal to the duration modulating sub-circuit sc2. In the image display mode, the duration modulating sub-circuit sc2 is configured to receive the compensated current signal from the current modulating sub-circuit sc1, and control a grayscale value of light emitted from the respective one of the plurality of micro LEDs based on time integration of the compensated current signal.

Various appropriate current modulating sub-circuits may be used as the current modulating sub-circuit sc1. FIG. 4 shows a 6T1C circuit as the current modulating sub-circuit sc1. Other appropriate current modulating sub-circuits include 3T1C, 3T2C, 4T1C, 4T2C, 5T1C, 5T2C, 6T2C, 7T1C, 7T2C, 8T1C, and 8T2C.

In some embodiments, the duration modulating sub-circuit sc2 includes two transistors and one capacitor. In some embodiments, the duration modulating sub-circuit sc2 includes a first transistor T8 having a source electrode connected to the current modulating sub-circuit sc1 to receive the compensated current signal from the current modulating sub-circuit sc1, a drain electrode connected to the respective one of the plurality of micro LEDs; a second transistor T7 having a source electrode connected to a data line (Vdata_T), a drain electrode connected to a gate electrode of the first transistor T8, and a gate electrode connected to a gate line (Gate_B); and a capacitor C2 having a first electrode connected to the drain electrode of the second transistor T7 and the gate electrode of the first transistor T8, and a second electrode configured to be provided with a common voltage Vcom (e.g., a ground voltage).

Figure 5:
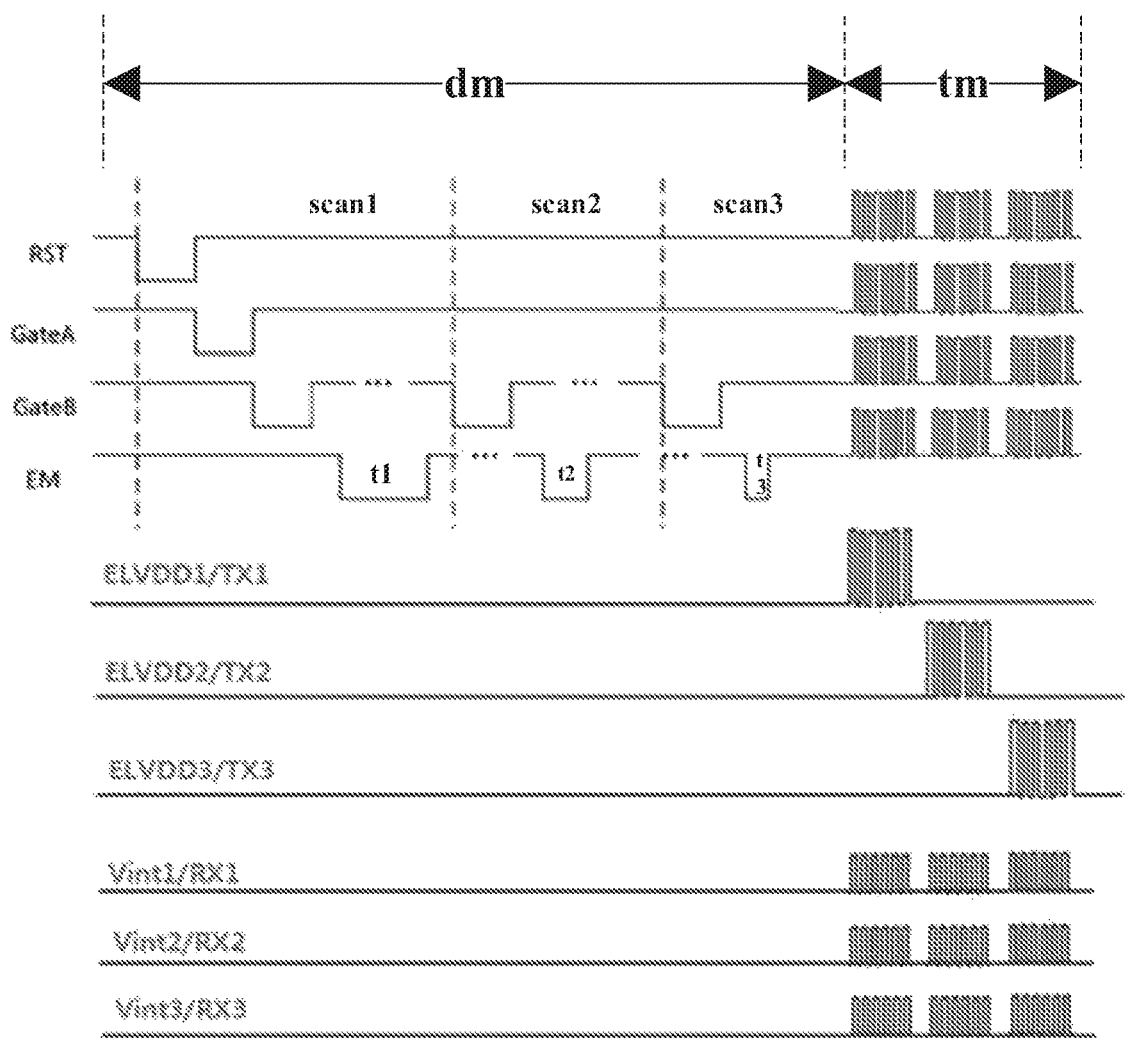
FIG. 5 is a timing diagram of operating a touch control micro LED display apparatus in some embodiments according to the present disclosure.

FIG. 5 is a timing diagram of operating a touch control micro LED display apparatus in some embodiments according to the present disclosure. Referring to FIG. 5, the touch control micro LED display apparatus is operated in a time-division driving mode including an image display mode dm and a touch control mode tm. RST represents a reset signal transmitted to a reset signal line Rst in FIG. 4; GateA represents a first scanning signal transmitted to a first gate line Gate_A for providing the first scanning signal to the current modulating sub-circuit sc1 in FIG. 4; GateB represents a second scanning signal transmitted to a second gate line Gate_B for providing the second scanning signal to the current modulating sub-circuit sc1 as well as the duration modulating sub-circuit sc2 in FIG. 4; and EM represents a light emitting control signal transmitted to a light emitting control signal line em in FIG. 4. ELVDD1/TX1, ELVDD2/TX2, and ELVDD3/TX3 represent touch scanning signals transmitted to the touch scanning electrodes (e.g., the plurality of second electrodes 60e). Vint1/RX1, Vint2/RX2, and Vint3/RX3 represent touch sensing signals from the touch sensing electrodes the plurality of third electrodes 70e).

Referring to FIG. 5, in some embodiments, in the touch control mode, at least one of signal lines of the pixel driving circuit is configured to transmit a signal having a waveform corresponding to a waveform of the touch scanning signals. In one example, a reset signal line (e.g., the reset signal line Rst in FIG. 4), a light emitting control signal line (e.g., the light emitting control signal line em in FIG. 4), and one or more gate scanning lines (e.g., the first gate line Gate_A and the second gate line Gate_B in FIG. 4) connected to the pixel driving circuit are configured to transmit the signal having the waveform corresponding to the waveform of the touch scanning signals. Optionally, the signal having the waveform corresponding to the waveform of the touch scanning signals is the same as the touch scanning signals, e.g., their waveforms are identical.

The signal lines of the pixel driving circuit are disposed below the plurality of second electrodes 60e, and spaced apart from the plurality of second electrodes 60e by an insulating layer. Parasitic capacitance may form between the plurality of second electrodes 60e and the signal lines of the pixel driving circuit. Having the signal lines of the pixel driving circuit to transmit the signal having the waveform corresponding to the waveform of the touch scanning signals during the touch control mode, loading of the plurality of second electrodes 60e can be effectively reduced.

In another aspect, the present disclosure provides a method of operating a touch control micro LED display apparatus as described herein or fabricated by a method described herein. In some embodiments, the method includes operating the touch control micro LED display apparatus in a time-division driving mode comprising an image display mode and a touch control mode. In the touch control mode, the method includes detecting a touch on a surface of the touch control micro LED display apparatus using the plurality of second electrodes and the plurality of third electrodes as touch electrodes of a mutual capacitance type. In the image display mode, the method includes providing a common voltage to the plurality of second electrodes; and displaying an image using a plurality of micro LEDs with the plurality of second electrodes as cathodes for the plurality of micro LEDs. As used herein, the term "common voltage" refers to a reference voltage provided by a common voltage source, typically provided from a peripheral area of the touch control micro LED display apparatus. In the touch control mode, the method further includes transmitting touch scanning signals respectively to the plurality of second electrodes; and detecting touch sensing signals transmitted from the plurality of third electrodes.

As discussed above, the pixel driving circuit includes a current modulating sub-circuit and a duration modulating sub-circuit. In some embodiments, in the touch control mode, the method further includes transmitting a signal having a waveform corresponding to a waveform of the touch scanning signals to at least one of signal lines of the pixel driving circuit for driving light emission of a respective one of the plurality of micro LEDs. The at least one of signal lines of the pixel driving circuit are signal lines connected to the current modulating sub-circuit or a duration modulating sub-circuit. Optionally, in the touch control mode, all signal lines connected to the pixel driving circuit are provided with the signal having a waveform corresponding to a waveform of the touch scanning signals. For example, in the touch control mode, a reset signal line, a light emitting control signal line, and one or more gate scanning lines connected to the pixel driving circuit are provided with the signal having a waveform corresponding to a waveform of the touch scanning signals. Optionally, the signal having the waveform corresponding to the waveform of the touch scanning signals is the same as the touch scanning signals.

In the image display mode, the method in sonic embodiment includes generating (e.g., by the current modulating sub-circuit) a compensated current signal based on a data signal input into the current modulating sub-circuit; and controlling (e.g., by the duration modulating sub-circuit) a grayscale value of light emitted from the respective one of the plurality of micro LEDs based on time integration of the compensated current signal.

In another aspect, the present disclosure provides a method of fabricating a touch control micro LED display apparatus. In some embodiments, the method includes forming a first electrode layer on a base substrate; forming a second electrode layer on a side of the first electrode layer away from the base substrate, wherein the second electrode layer includes a plurality of second electrodes spaced apart from each other; forming an insulating layer on a side of the second electrode layer away from the base substrate; and forming a third electrode layer on a side of the insulating layer away from the base substrate, wherein the third electrode layer comprises a plurality of third electrodes spaced apart from each other. The touch control micro LED display apparatus fabricated by the present method is operated in a time-division driving mode including an image display mode and a touch control mode. The plurality of second electrodes and the plurality of third electrodes are touch electrodes of a mutual capacitance type in the touch control mode. The plurality of second electrodes are cathodes for a plurality of micro LEDs in the image display mode.

Figure 6A:
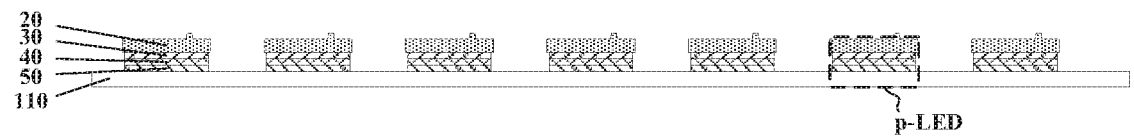
FIGS. 6A to 6F illustrate a method of fabricating a touch control micro LED display apparatus in some embodiments according to the present disclosure.

FIGS. 6A to 6F illustrate a method of fabricating a touch control micro LED display apparatus in some embodiments according to the present disclosure. Referring to FIG. 6A, a plurality of micro LED precursor units p-LEDs are formed. Forming the plurality of micro LED precursor units p-LEDs includes forming the second type doped semiconductor layer 50 on a growth substrate 110; forming the quantum-well layer 40 on a side of the second type doped semiconductor layer 50 away from the growth substrate 110; forming the first type doped semiconductor layer 30 on a side of the quantum-well layer 40 away from the growth substrate 110; and forming the first electrode layer 20 on a side of the first type doped semiconductor layer 30 away from the growth substrate 110.

In some embodiments, forming the plurality of micro LED precursor units p-LEDs includes forming a second type doped semiconductor material layer on the growth substrate 110; forming a quantum-well material layer on a side of the second type doped semiconductor material layer away from the growth substrate 110; forming a first type doped semiconductor material layer on a side of the quantum-well material layer away from the growth substrate 110; and forming a first electrode material layer on a side of the first type doped semiconductor material layer away from the growth substrate 110. Optionally, forming the plurality of micro LED precursor units p-LEDs further includes removing portion of semiconductor materials corresponding to areas between adjacent precursor units of the plurality of micro LED precursor units p-LEDs. Examples of methods suitable for removing the semiconductor materials include, but not limited to, dry etching process. In one example, the semiconductor materials corresponding to areas between adjacent precursor units of the plurality of micro LED precursor units p-LEDs may be over-etched.

Figure 6B:
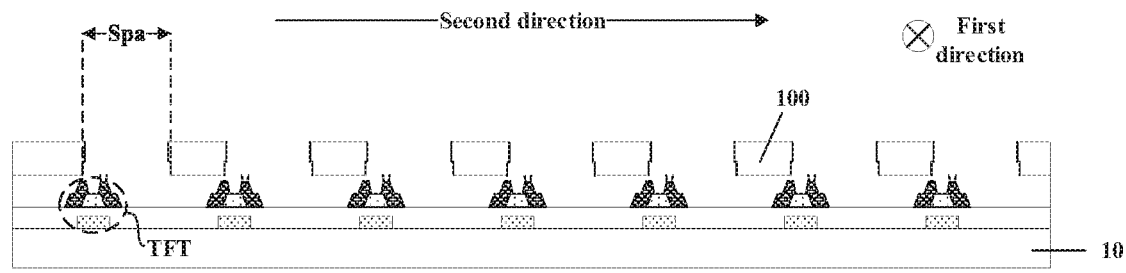

Referring to FIG. 6B, a target substrate is formed. Forming the target substrate includes forming a plurality of thin film transistors TFT on a base substrate 10; and forming a pixel definition layer 100 on the base substrate 10 to define a plurality of subpixel apertures Spa.

Figure 6C:
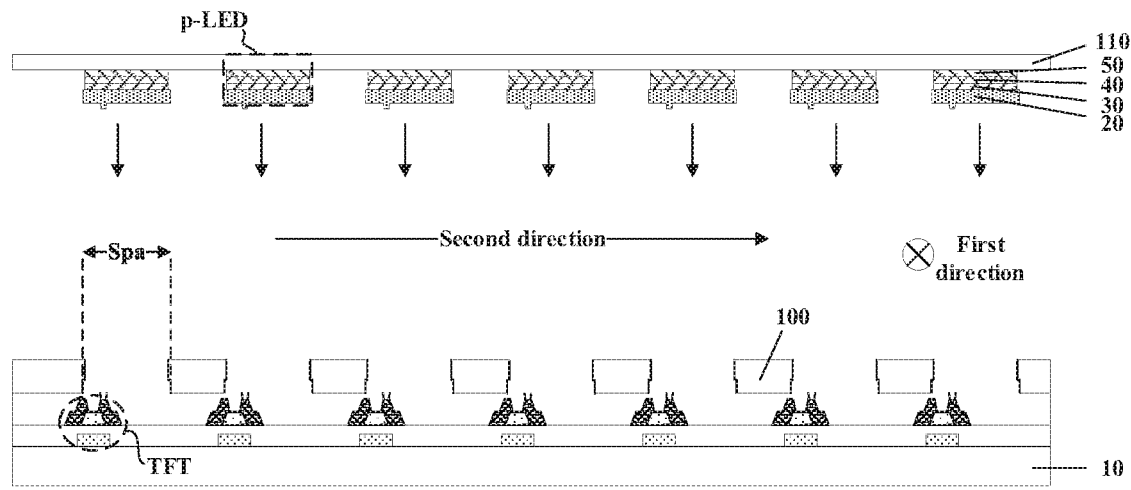

Referring to FIG. 6C, the method further includes transferring the plurality of micro LED precursor units p-LEDs respectively into the plurality of subpixel apertures Spa. Various appropriate methods may be used for transferring the plurality of micro LED precursor units p-LEDs respectively into the plurality of subpixel apertures Spa. Examples of transferring methods include a mass transfer method and a pick-and-place transfer method, FIG. 6C illustrates an exemplary mass transfer method. Subsequent to transferring the plurality of micro LED precursor units p-LEDs respectively into the plurality of subpixel apertures Spa, the growth substrate 110 can be removed from the target substrate, e.g., by a lift-off method.

Figure 6D:
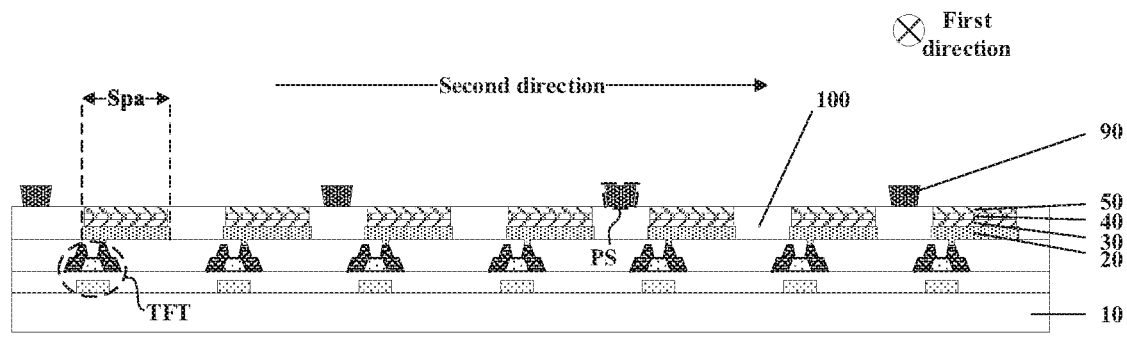

Referring to FIG. 6D, subsequent to transferring the plurality of micro LED precursor units p-LEDs respectively into the plurality of subpixel apertures Spa, a spacer layer 90 is formed on a side of the pixel definition layer 100 away from the base substrate 10. Forming the spacer layer 90 includes forming an insulating material layer on a side of the pixel definition layer 100 away from the base substrate 10; and patterning the insulating material layer to form a plurality of spacers PS. Optionally, a negative photoresist material layer is formed on a side of the pixel definition layer 100 away from the base substrate 10, the negative photoresist material layer is exposed and developed, and the plurality of spacers PS are formed to have an undercut profile. For example, a cross-section of a respective one of the plurality of spacers PS along a plane perpendicular to the base substrate 10 and intersecting the plurality of spacers PS has a substantially trapezoidal shape, as shown in FIG. 6D.

Figure 6E:
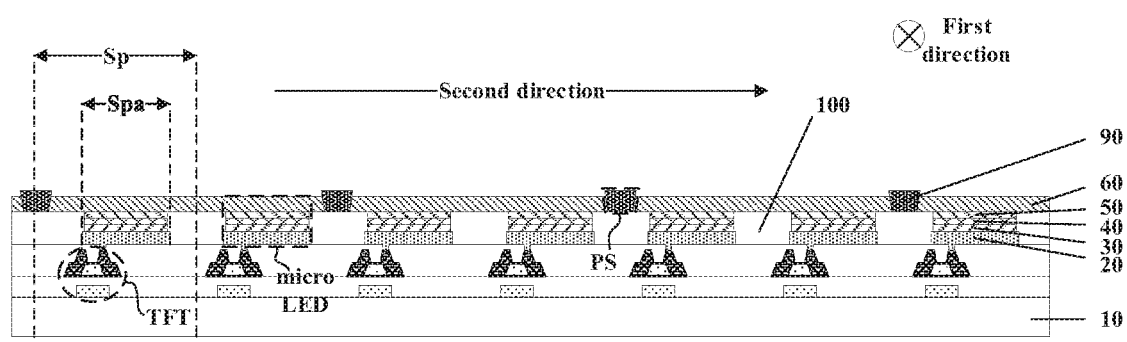

Referring to FIG. 6E, subsequent to forming the spacer layer 90, a second electrode layer is formed on a side of the pixel definition layer 100 away from the base substrate 10. Optionally, the second electrode layer is formed by depositing a conductive material on the target substrate. In one example, the conductive material is deposited on the target substrate in an open mask process. Because the plurality of spacers PS are formed to have an undercut profile, a plurality of second electrodes can be formed spaced apart from each other. As shown in FIG. 6E and FIG. 2, the plurality of second electrodes 60e and the plurality of spacers PS are formed to be arranged along the second direction, and each of the plurality of spacers PS and each of the plurality of second electrodes 60e extend along the first direction. The plurality of spacers PS and the plurality of second electrodes 60e are alternately arranged. Two adjacent second electrodes of the plurality of second electrodes 60e are spaced apart by one of the plurality of spacers PS. By forming the plurality of spacers PS having the undercut profile, short circuit between adjacent second electrodes of the plurality of second electrodes 60e during the step of forming the plurality of second electrodes 60e can be prevented.

Figure 6F:
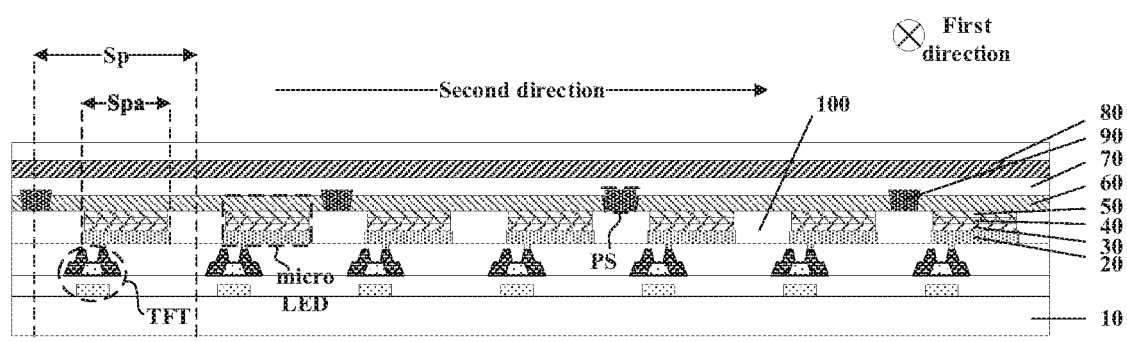

Referring to FIG. 6F, an insulating layer 70 is then formed on a side of the second electrode layer 60 away from the base substrate 10; and a third electrode layer 80 is formed on a side of the insulating layer 70 away from the base substrate 10. Referring to FIG. 6F and FIG. 2, in some embodiments, forming the third electrode layer 80 includes forming a plurality of third electrodes 70e spaced apart from each other. Optionally, the plurality of third electrodes 70e are formed to be arranged along the first direction, and each of the plurality of third electrodes 70e extends along the second direction.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch control micro light emitting diode (micro LED) display apparatus, comprising:
   a base substrate;
   a first electrode layer on the base substrate;
   a second electrode layer on a side of the first electrode layer away from the base substrate, wherein the second electrode layer comprises a plurality of second electrodes spaced apart from each other;
   an insulating layer on a side of the second electrode layer away from the base substrate; and
   a third electrode layer on a side of the insulating layer away from the base substrate, wherein the third electrode layer comprises a plurality of third electrodes spaced apart from each other;
   wherein the touch control micro LED display apparatus is operated in a time-division driving mode comprising an image display mode and a touch control mode;
   the plurality of second electrodes and the plurality of third electrodes are touch electrodes of a mutual capacitive type in the touch control mode; and
   the plurality of second electrodes are cathodes for a plurality of micro LEDs in the image display mode.

2. The touch control micro LED display apparatus of claim 1, further comprising:
   a first type doped semiconductor layer on a side of the first electrode layer away from the base substrate and electrically connected to the first electrode layer;
   a quantum-well layer on a side of the first type doped semiconductor layer away from the base substrate;
   a second type doped semiconductor layer on a side of the quantum-well layer away from the base substrate; and
   a spacer layer on a side of the second type doped semiconductor layer away from the base substrate;
   wherein the spacer layer comprises a plurality of spacers, the plurality of spacers and the plurality of second electrodes are alternately arranged; and
   two adjacent second electrodes of the plurality of second electrodes are spaced apart by one of the plurality of spacers.

3. The touch control micro LED display apparatus of claim 2, wherein the plurality of third electrodes are arranged along a first direction;
   the plurality of second electrodes are arranged along a second direction;
   the plurality of spacers are arranged along the second direction; and
   the second direction is different from the first direction.

4. The touch control micro LED display apparatus of claim 3, wherein an orthographic projection of a respective one of the plurality of second electrodes on the base substrate at least partially overlaps with an orthographic projection of a row of micro LEDs of the plurality of micro LEDs along the first direction on the base substrate; and an orthographic projection of a respective one of the plurality of third electrodes on the base substrate at least partially overlaps with an orthographic projection of a column of micro LEDs of the plurality of micro LEDs along the second direction on the base substrate.

5. The touch control micro LED display apparatus of claim 2, wherein the first electrode layer comprises a plurality of first electrode blocks;

the first type doped semiconductor layer comprises a plurality of first type doped semiconductor blocks;

the quantum-well layer comprises a plurality of quantum-well blocks;

the second type doped semiconductor layer comprises a plurality of second type doped semiconductor blocks;

a respective one of the plurality of micro LEDs comprises a respective one of the plurality of first electrode blocks, a respective one of the plurality of first type doped semiconductor blocks, a respective one of the plurality of quantum-well blocks, and a respective one of the plurality of second type doped semiconductor blocks;

the respective one of the plurality of second type doped semiconductor blocks of the respective one of the plurality of micro LEDs is electrically connected to one of the plurality of second electrodes; and an orthographic projection of the respective one of the plurality of first electrode blocks on the base substrate at least partially overlaps with an orthographic projection of the one of the plurality of second electrodes on the base substrate.

6. The touch control micro LED display apparatus of claim 5, further comprising a pixel definition layer defining a plurality of subpixel apertures;

wherein the respective one of the plurality of first electrode blocks, the respective one of the plurality of first type doped semiconductor blocks, the respective one of the plurality of quantum-well blocks, and the respective one of the plurality of second type doped semiconductor blocks, of the respective one of the plurality of micro LEDs, are in a respective one of the plurality of subpixel apertures; and the second electrode layer and the spacer layer are on a side of the pixel definition layer away from the base substrate.

7. The touch control micro LED display apparatus of claim 1, further comprising a touch driving circuit;

wherein the plurality of second electrodes are electrically connected to the touch driving circuit;

in the image display mode, the touch driving circuit is configured to provide a common voltage to the plurality of second electrodes;

in the touch control mode, the touch driving circuit is configured to provide touch scanning signals respectively to the plurality of second electrodes; and in the touch control mode, the plurality of third electrodes are configured to respectively transmit touch sensing signals to the touch driving circuit.

8. The touch control micro LED display apparatus of claim 7, further comprising a pixel driving circuit for driving light emission of a respective one of the plurality of micro LEDs in the image display mode;

wherein, in the touch control mode, at least one of signal lines of the pixel driving circuit is configured to transmit a signal having a waveform corresponding to a waveform of the touch scanning signals.

9. The touch control micro LED display apparatus of claim 8, wherein a reset signal line, a light emitting control signal line, and one or more gate scanning lines connected to the pixel driving circuit are configured to transmit the signal having the waveform corresponding to the waveform of the touch scanning signals.

10. The touch control micro LED display apparatus of claim 8, wherein the signal having the waveform corresponding to the waveform of the touch scanning signals is the same as the touch scanning signals.

11. The touch control micro LED display apparatus of claim 8, wherein the pixel driving circuit comprises a current modulating sub-circuit and a duration modulating sub-circuit;

wherein, in the image display mode, the current modulating sub-circuit is configured to generate a compensated current signal based on a data signal, and transmit the compensated current signal to the duration modulating sub-circuit; and the duration modulating sub-circuit is configured to receive the compensated current signal from the current modulating sub-circuit, and control a grayscale value of light emitted from the respective one of the plurality of micro LEDs based on time integration of the compensated current signal.

12. The touch control micro LED display apparatus of claim 11, wherein the duration modulating sub-circuit comprises:

a first transistor having a source electrode connected to the current modulating sub-circuit, a drain electrode connected to the respective one of the plurality of micro LEDs;

a second transistor having a source electrode connected to a data line, a drain electrode connected to a gate electrode of the first transistor, and a gate electrode connected to a gate line; and a capacitor having a first electrode connected to the drain electrode of the second transistor and the gate electrode of the first transistor, and a second electrode configured to be provided with a common voltage.

13. A method of operating a touch control micro light emitting diode (micro LED) display apparatus;

wherein the touch control micro LED display apparatus comprises:

a base substrate;

a first electrode layer on the base substrate;

a second electrode layer on a side of the first electrode layer away from the base substrate, wherein the second electrode layer comprises a plurality of second electrodes spaced apart from each other;

an insulating layer on a side of the second electrode layer away from the base substrate; and a third electrode layer on a side of the insulating layer away from the base substrate, wherein the third electrode layer comprises a plurality of third electrodes spaced apart from each other;

wherein the method comprises:

operating the touch control micro LED display apparatus in a time-division driving mode comprising an image display mode and a touch control mode;

detecting a touch in the touch control mode using the plurality of second electrodes and the plurality of third electrodes as touch electrodes of a mutual capacitive type;

providing a common voltage to the plurality of second electrodes in the image display mode; and displaying an image using a plurality of micro LEDs with the plurality of second electrodes as cathodes for the plurality of micro LEDs.

14. The method of claim 13, further comprising:

transmitting touch scanning signals respectively to the plurality of second electrodes in the touch control mode; and detecting touch sensing signals transmitted from the plurality of third electrodes in the touch control mode.

15. The method of claim 14, further comprising, in the touch control mode, transmitting a signal having a waveform corresponding to a waveform of the touch scanning signals to at least one of signal lines of a pixel driving circuit for driving light emission of a respective one of the plurality of micro LEDs.

16. The method of claim 15, comprising, in the touch control mode, transmitting the signal having the waveform corresponding to a waveform of the touch scanning signals to a reset signal line, a light emitting control signal line, and one or more gate scanning lines connected to the pixel driving circuit.

17. The method of claim 15, wherein the signal having the waveform corresponding to the waveform of the touch scanning signals is the same as the touch scanning signals.

18. The method of claim 13, in the image display mode, further comprising:

generating a compensated current signal based on a data signal; and controlling a grayscale value of light emitted from the respective one of the plurality of micro LEDs based on time integration of the compensated current signal.

19. A method of fabricating a touch control micro light emitting diode (micro LED) display apparatus, comprising:

forming a first electrode layer on a base substrate;

forming a second electrode layer on a side of the first electrode layer away from the base substrate, wherein the second electrode layer comprises a plurality of second electrodes spaced apart from each other;

forming an insulating layer on a side of the second electrode layer away from the base substrate; and forming a third electrode layer on a side of the insulating layer away from the base substrate, wherein the third electrode layer comprises a plurality of third electrodes spaced apart from each other;

wherein the touch control micro LED display apparatus is operated in a time-division driving mode comprising an image display mode and a touch control mode;

the plurality of second electrodes and the plurality of third electrodes are touch electrodes of a mutual capacitive type in the touch control mode; and the plurality of second electrodes are cathodes for a plurality of micro LEDs in the image display mode.

20. The method of claim 19, further comprising forming a plurality of micro LED precursor units, comprising:

forming a second type doped semiconductor layer on a growth substrate;

forming a quantum-well layer on a side of the second type doped semiconductor layer away from the growth substrate;

forming a first type doped semiconductor layer on a side of the quantum-well layer away from the growth substrate; and forming the first electrode layer on a side of the first type doped semiconductor layer away from the growth substrate;

wherein the method further comprises:

forming a pixel definition layer on the base substrate to define a plurality of subpixel apertures; and transferring the plurality of micro LED precursor units respectively into the plurality of subpixel apertures;

wherein forming the second electrode layer is performed subsequent to transferring the plurality of micro LED precursor units into the plurality of subpixel apertures.

* * * * *